(12) United States Patent
Duan

(10) Patent No.: US 11,374,062 B2
(45) Date of Patent: Jun. 28, 2022

(54) DISPLAY PANEL INCLUDING A PEROVSKITE COLOR CONVERSION FUNCTIONAL LAYER

(71) Applicant: SHENZHEN CHINA STAR OPTOELECTRONICS SEMICONDUCTOR DISPLAY TECHNOLOGY CO., LTD., Shenzhen (CN)

(72) Inventor: Miao Duan, Shenzhen (CN)

( * ) Notice: Subject to any disclaimer, the term of this patent is extended or adjusted under 35 U.S.C. 154(b) by 221 days.

(21) Appl. No.: 16/620,505

(22) PCT Filed: Nov. 7, 2019

(86) PCT No.: PCT/CN2019/116387
§ 371 (c)(1),
(2) Date: Dec. 8, 2019

(87) PCT Pub. No.: WO2021/082042
PCT Pub. Date: May 6, 2021

(65) Prior Publication Data
US 2021/0408129 A1    Dec. 30, 2021

(30) Foreign Application Priority Data
Oct. 28, 2019   (CN) .......................... 201911029741.1

(51) Int. Cl.
*H01L 27/32*  (2006.01)
*H01L 51/50*  (2006.01)
*H01L 51/52*  (2006.01)

(52) U.S. Cl.
CPC ........ *H01L 27/322* (2013.01); *H01L 51/5253* (2013.01); *H01L 27/3218* (2013.01);
(Continued)

(58) Field of Classification Search
CPC ............... H01L 27/322; H01L 27/3244; H01L 27/3211; H01L 27/3246; H01L 27/3272;
(Continued)

(56) References Cited

U.S. PATENT DOCUMENTS

2005/0140276 A1* 6/2005 Park .................... H01L 27/3251
                                                            313/506
2008/0218071 A1* 9/2008 Kobayashi ............ H01L 27/322
                                                            313/506
(Continued)

FOREIGN PATENT DOCUMENTS

CN   103545404 A   1/2014
CN   106526962 A   3/2017
(Continued)

*Primary Examiner* — Ida M Soward

(57) ABSTRACT

The present disclosure provides a display panel and a manufacturing method of the display panel, the display panel includes a base substrate, a pixel definition layer, and a color conversion medium; the pixel definition layer and the color conversion medium are successively formed on the base substrate; a pixel opening is defined on the pixel definition layer, the color conversion medium is positioned in the pixel opening; the color conversion medium includes a perovskite color conversion functional layer and a first water-oxygen barrier layer; the first water-oxygen barrier layer is positioned on a side of the perovskite color conversion functional layer away from the base substrate.

9 Claims, 6 Drawing Sheets

(52) U.S. Cl.
CPC ...... *H01L 27/3244* (2013.01); *H01L 27/3253* (2013.01); *H01L 51/5048* (2013.01); *H01L 51/5056* (2013.01); *H01L 51/5072* (2013.01); *H01L 51/5088* (2013.01); *H01L 51/5092* (2013.01); *H01L 51/5096* (2013.01)

(58) Field of Classification Search
CPC ............ H01L 27/3218; H01L 51/5253; H01L 27/3295; H01L 27/3253; H01L 51/5088; H01L 51/5092; H01L 51/5096; H01L 51/5048; H01L 51/5056; H01L 51/5072; G02F 2001/136222
See application file for complete search history.

(56) References Cited

U.S. PATENT DOCUMENTS

| | | | |
|---|---|---|---|
| 2016/0372528 A1* | 12/2016 | Kamura | H01L 51/5284 |
| 2019/0018287 A1* | 1/2019 | Lüchinger | C09K 11/665 |
| 2019/0245155 A1 | 8/2019 | Heath | |
| 2020/0006437 A1* | 1/2020 | Kim | H01L 51/5275 |
| 2020/0081292 A1* | 3/2020 | Park | H01L 27/322 |
| 2021/0097943 A1* | 4/2021 | Wyatt | H01L 27/15 |

FOREIGN PATENT DOCUMENTS

| | | |
|---|---|---|
| CN | 109378394 A | 2/2019 |
| CN | 109979960 A | 7/2019 |
| CN | 111257983 A | 6/2020 |

\* cited by examiner

DISPLAY PANEL INCLUDING A PEROVSKITE COLOR CONVERSION FUNCTIONAL LAYER

FIELD OF INVENTION

The present disclosure relates to a technology field of display panels, and particularly relates to a display panel and a manufacturing method thereof.

BACKGROUND OF INVENTION

The statements herein merely provide background information related to the present disclosure, and do not necessarily constitute prior art.

A main technical route of organic light emitting diode (OLED) devices is illumination of three primary colors of red, green, blue (RGB). OLED devices having three side by side RGB sub-pixels (SBS) are manufactured by a fine metal mask (FMM). However, as the market demands higher resolution, this technical route is limited by accuracy of FMM to become more and more difficult. Another way to achieve full color display is white OLED+RGB filter (Color Filter, CF) technology, which can be used to prepare OLED displays with high resolution, as mature CF technology is applied and it is not limited by the accuracy of FMM. However, the three primary colors obtained in this way have low saturation, and the display gamut is not wide enough (NTSC color gamut <90%). There is also a scheme for realizing full color based on a blue OLED and by means of green and red color conversion method (CCM), red and green light color conversion materials are excited by blue light to emit light, thereby obtaining the three primary colors of red, green, and blue to achieve color displaying.

Organic-inorganic hybrid perovskite (perovskite) materials have excellent photoelectric properties, such as high fluorescence quantum efficiency, low defect state density, adjustable optical band gap, and high carrier mobility, etc. Particularly, a notarization efficiency of solar cells using the perovskite materials as light absorbing materials has reached 24.2%, exceeding that of polysilicon. The perovskite materials can be applied not only as light absorbing materials to solar cells, but also as luminescent materials to LEDs. In addition, the perovskite materials can also be used as color conversion film materials, and then developed into a new display device, namely Pe-OLED, with an AMOLED (Active-matrix organic light emitting diode). The new light-emitting display device has advantages of pure color, wide color gamut, and low cost.

Since a half-peak width of the perovskite material is narrow (<30 nm), its color conversion effect is comparable to or better than that of the quantum dot color conversion film. Compared with traditional quantum dot materials (such as Cd series), the perovskite materials have advantages of low raw material cost and simple synthesis, but their stability is inferior to inorganic quantum dot materials, and the perovskite materials are relatively poorly resistant to moisture and oxygen. Therefore, a structure of the perovskite color conversion film needs to be adjusted and optimized to improve its stability.

Technical Problem

The present disclosure provides a display panel and a manufacturing method thereof, which solves the problem of poor stability of a color conversion medium made of perovskite materials in a display panel, by providing a water-oxygen barrier layer on a perovskite color conversion functional layer.

SUMMARY OF INVENTION

TO solve the above problems, the technical solutions provided by the present disclosure are as follows:

The present disclosure provides a display panel, including a base substrate, a pixel definition layer, and a color conversion medium, the pixel definition layer and the color conversion medium are successively formed on the base substrate; a pixel opening is defined on the pixel definition layer, the color conversion medium is positioned in the pixel opening;

the color conversion medium comprises a perovskite color conversion functional layer and a first water-oxygen barrier layer; the first water-oxygen barrier layer is positioned on a side of the perovskite color conversion functional layer away from the base substrate.

In the display panel of an embodiment according to the present disclosure, the perovskite color conversion functional layer includes a plurality of stacked perovskite color conversion films and a plurality of second water-oxygen barrier layers, each of the second water-oxygen barrier layers is sandwiched between any two adjacent layers of the perovskite color conversion films.

In the display panel of an embodiment according to the present disclosure, a material of the first water-oxygen barrier layer includes polymethyl methacrylate.

In the display panel of an embodiment according to the present disclosure, a material of the first water-oxygen barrier layer and a material of the second water-oxygen barrier layer are the same.

In the display panel of an embodiment according to the present disclosure, the first water-oxygen barrier layer is positioned on the perovskite color conversion functional layer and the pixel definition layer.

In the display panel of an embodiment according to the present disclosure, the pixel opening comprises a plurality of subpixel openings, the subpixel openings are array-arranged; the color conversion medium is positioned in the subpixel openings;

the perovskite color conversion films in each of the subpixel openings comprises red conversion films, green conversion films, or blue conversion films.

In the display panel of an embodiment according to the present disclosure, a material of the red conversion film includes $CH_3NH_3Pb(Br/I)_3$ or $CsPb(Br/I)_3$, a material of the green conversion film includes $CH_3NH_3PbBr_3$ or $CsPbBr_3$, and a material of the blue conversion film includes $CH_3NH_3Pb(Br/Cl)_3$ or $CsPb(Br/Cl)_3$.

In the display panel of an embodiment according to the present disclosure, the display panel further includes a TFT array substrate opposite to the base substrate and a blue OLED device sandwiched between the base substrate and the TFT array substrate, and the color conversion medium is positioned on a side of the base substrate adjacent to the blue OLED device.

In the display panel of an embodiment according to the present disclosure, a color filter is sandwiched between the base substrate and the pixel definition layer, and the color filter includes a color resistance disposed corresponding to the pixel opening, and a light shielding layer disposed around the color resistance.

The present disclosure further provides a display panel, including a base substrate, a pixel definition layer, and a color conversion medium, the pixel definition layer and the color conversion medium are successively formed on the base substrate; a pixel opening is defined on the pixel definition layer, the color conversion medium is positioned in the pixel opening;

wherein, the color conversion medium includes a first perovskite color conversion film, a second perovskite color conversion film stacked on the first perovskite color conversion film, a second water-oxygen barrier layer sandwiched between the first perovskite color conversion film and the second perovskite color conversion film, and a first water-oxygen barrier layer positioned on a side of the second perovskite color conversion film way from the base substrate.

In the display panel of an embodiment according to the present disclosure, a material of the first water-oxygen barrier layer includes polymethyl methacrylate; the material of the first water-oxygen barrier layer and a material of the second water-oxygen barrier layer are the same.

In the display panel of an embodiment according to the present disclosure, a thickness of the first perovskite color conversion film and a thickness of the second perovskite color conversion film are the same.

In the display panel of an embodiment according to the present disclosure,

The present disclosure further provides a manufacturing method of a display panel, including:

providing a base substrate;

forming a pixel definition layer on the base substrate; wherein a pixel opening is defined on the pixel definition layer; and successively forming a perovskite color conversion functional layer and a first water-oxygen barrier layer in the pixel opening, to obtain a color conversion medium.

In the manufacturing method of the display panel of an embodiment according to the present disclosure, the step of "successively forming a perovskite color conversion functional layer and a first water-oxygen barrier layer in the pixel opening" includes:

forming a plurality of perovskite color conversion films by inkjet printing technology, and forming a second water-oxygen barrier layer sandwiched between any two adjacent layers of the perovskite color conversion films, the perovskite color conversion films and the second water-oxygen barrier layers form the perovskite color conversion functional layer; and forming the first water-oxygen barrier layer on the perovskite color conversion functional layer.

In the manufacturing method of the display panel of an embodiment according to the present disclosure, a material of the first water-oxygen barrier layer includes polymethyl methacrylate.

In the manufacturing method of the display panel of an embodiment according to the present disclosure, a material of the first water-oxygen barrier layer and a material of the second water-oxygen barrier layer are the same.

Beneficial Effect

The beneficial effects of the present disclosure: in the present disclosure, the materials of the perovskite color conversion functional layer of the color conversion medium includes a perovskite material having a good color conversion effect. Since the perovskite material is relatively poor in resistance to moisture and oxygen, the first water-oxygen barrier layer is disposed on the perovskite color conversion functional layer, which can effectively seal the perovskite color conversion functional layer in the pixel opening, thereby avoiding the perovskite material contacting with moisture and oxygen, and then improving the stability of the perovskite color conversion functional layer, that is, the stability of the color conversion medium is improved.

DESCRIPTION OF DRAWINGS

In order to more clearly illustrate the technical solutions in the embodiments or the prior art, the drawings to be used in the descriptions of the embodiments or the prior art will be briefly described below. Obviously, the drawings in the following description are merely embodiments of the present disclosure. For those of ordinary skill in the art, other drawings may be obtained from the drawings without any creative work.

DETAILED DESCRIPTION OF EMBODIMENTS

Figure 1:
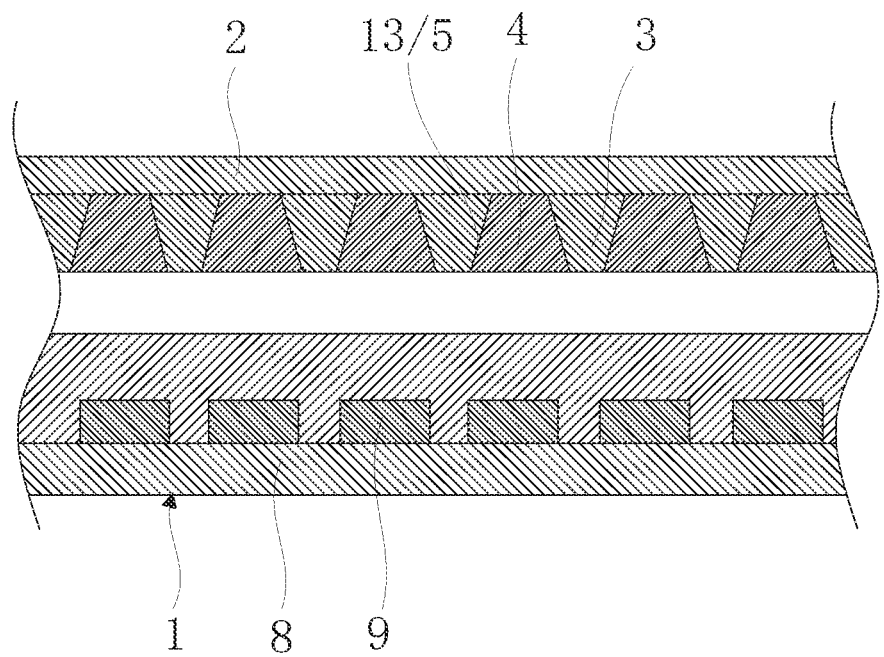
FIG. 1 is a partially schematic structural view of a display panel of an embodiment according to the present disclosure.

The specific structures and functional details disclosed herein are merely representative, and are for purposes of describing exemplary embodiments of the present disclosure. However, the present disclosure may be embodied in many alternative forms and should not be construed as being limited to the embodiments set forth herein.

In description of the present disclosure, it should be understood that orientation or position relations represented by directional terms mentioned in the present disclosure, such as "central", "lateral", "up", "down", "left", "right", "vertical", "horizontal", "top", "bottom", "inner", or "outer", etc. are orientation or position relations based on illustration of the drawings, merely for the convenience of describing the present disclosure and simplifying the description, rather than indicating or implying that the device or element is intended to have a particular orientation, or is constructed and operated in a particular orientation and therefore should not be interpreted as a limitation of the application. In addition, terms such as "first" and "second" are used herein for purposes of description, and should not be interpreted as indication or implication of relative importance, or implied indication of a number of the technical features. Therefore, features limited by terms such as "first" and "second" can explicitly or impliedly includes one or more than one these features. In description of the disclosure, "a plurality of" means two or more than two, unless otherwise specified. Furthermore, the term "comprising" and its variations are intended to cover an open-ended inclusion.

In description of the present disclosure, it should be noted, the terms "install", "connect", and "couple" shall be understood broadly, unless otherwise explicitly stated and defined, and may be, for example, a fixed connection, a detachable connection, or an integral connection; a mechanical connection or an electrical connection; directly connected or indirectly connected through an intermediate medium; an internal connection of the two elements. The specific meanings of the above terms in the present disclosure can be understood in the specific circumstances for those skilled in the art.

The terminologies used herein are for the purpose of describing specific embodiments, and rather than intending to limit exemplary embodiments. Unless the context clearly states otherwise, the singular forms "a" and "an" are also intended to include plural. It should be also understood that the terms "comprises" and/or "comprising", as used herein, are intended to mean the presence of the recited features, integers, steps, operations, units and/or components; and one or more other features, integers, steps, operations, units, components, and/or combinations thereof are not excluded.

The present disclosure will be further described below in conjunction with the accompanying drawings and embodiments.

Referring to FIG. 1 to FIG. 4, an embodiment of the present disclosure provides a display panel 1 including a base substrate 2, a pixel definition layer 3, and a color conversion medium 4; the pixel definition layer 3 and the color conversion medium 4 are successively formed on the base substrate 2; a pixel opening 5 is defined on the pixel definition layer 3, the color conversion medium 4 is positioned in the pixel opening 5; the color conversion medium 4 includes a perovskite color conversion functional layer 6 and a first water-oxygen barrier layer 7; the first water-oxygen barrier layer 7 is positioned on a side of the perovskite color conversion functional layer 6 away from the base substrate 2. Therein, a material of the perovskite color conversion functional layer 6 includes perovskite materials; a material of the first water-oxygen barrier layer 7 includes polymethyl methacrylate.

Specifically, the display panel 1 further includes a thin film transistor (TFT) array substrate 8 opposite to the base substrate 2 and a blue OLED device 9 sandwiched between the base substrate 2 and the TFT array substrate 8, the color conversion medium 4 is positioned on a side of the base substrate 2 adjacent to the blue OLED device 9. The blue OLED device 9 includes an anode, a hole injection layer, a hole transfer layer, a blue light emitting layer, an electron transfer layer, an electron blocking layer, and a cathode, which are successively disposed on the TFT array substrate 8. Of course, the blue OLED device 9 can also be replaced with a white OLED device, which is not limited herein; the blue OLED device 9 is also provided with an encapsulation layer (not shown).

In this embodiment, a material of the perovskite color conversion functional layer 6 of the color conversion medium 4 includes a perovskite material having a good color conversion effect. Since the perovskite material has a relatively poor resistance to moisture and oxygen, the first water-oxygen barrier layer 7 disposed on the perovskite color conversion functional layer 6 can effectively seal the perovskite color conversion functional layer 6 in the pixel opening 5, thereby avoiding perovskite material contacting with moisture and oxygen, and then improving the stability of the perovskite color conversion functional layer 6, that is, improving the stability of the color conversion medium 4.

Figure 2:
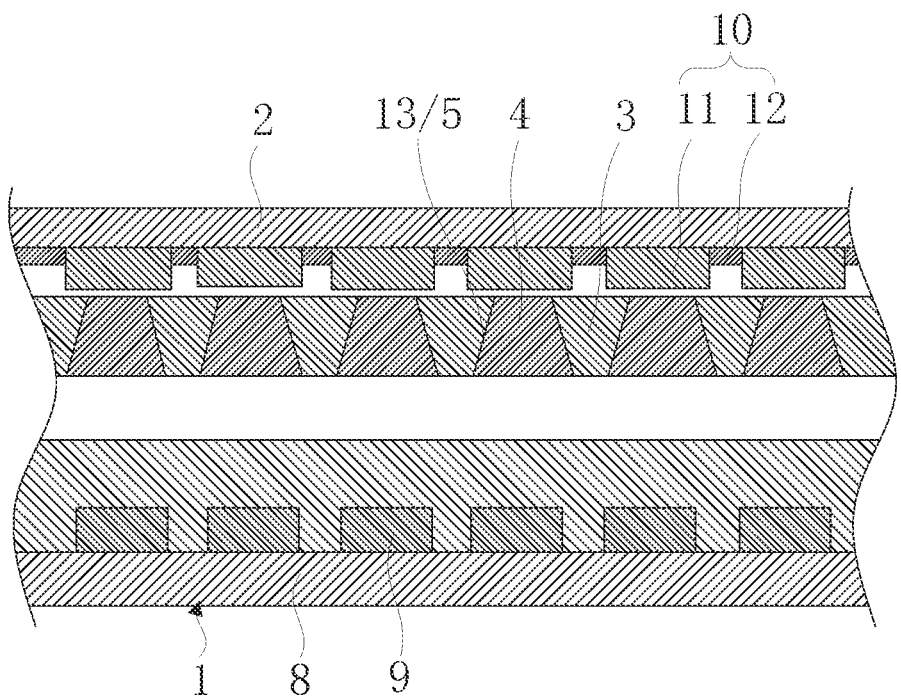
FIG. 2 is a partially schematic structural view of another display panel of an embodiment according to the present disclosure.

In an embodiment, as shown in FIG. 2, a color filter 10 is sandwiched between the base substrate 2 and the pixel definition layer 3; the color filter 10 includes a color resistance 11 (such as a red resistance, a green resistance, or a blue resistance) disposed corresponding to the pixel opening 5, and a light shielding layer 12 disposed around the color resistance 11; a protective payer (not labeled in the figures) is sandwiched between the color filter 10 and the pixel definition layer 3. In this embodiment, the color filter 10 can filter out part of the light source that is not converted by the color conversion medium 4, which is beneficial to improving the display effect of the display panel 1.

Figure 3:
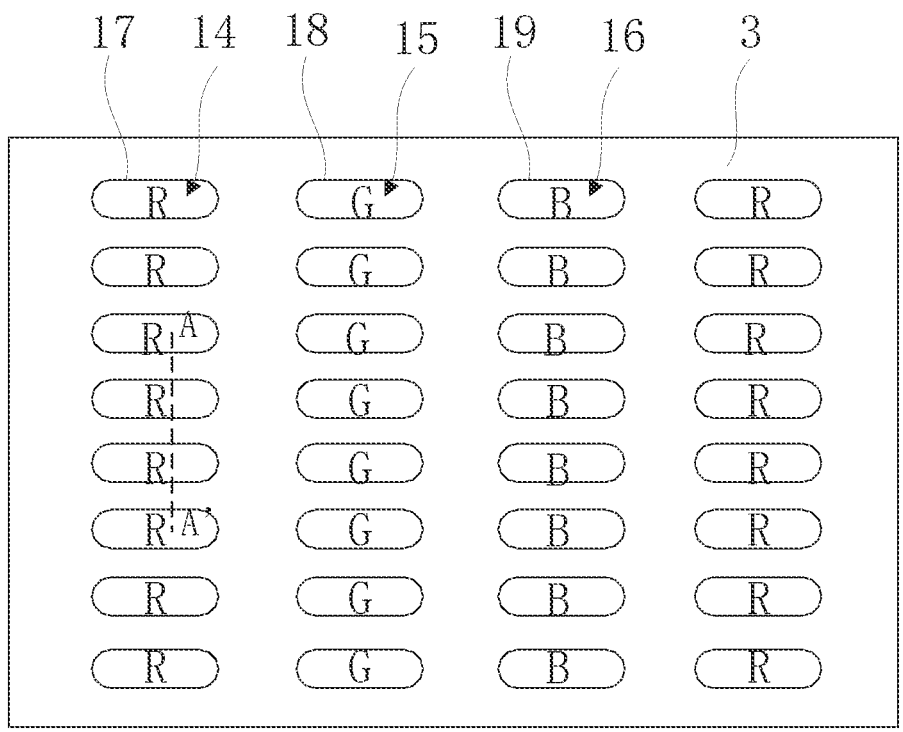
FIG. 3 is a plan view of a color conversion medium of an embodiment according to the present disclosure.
Figure 4:
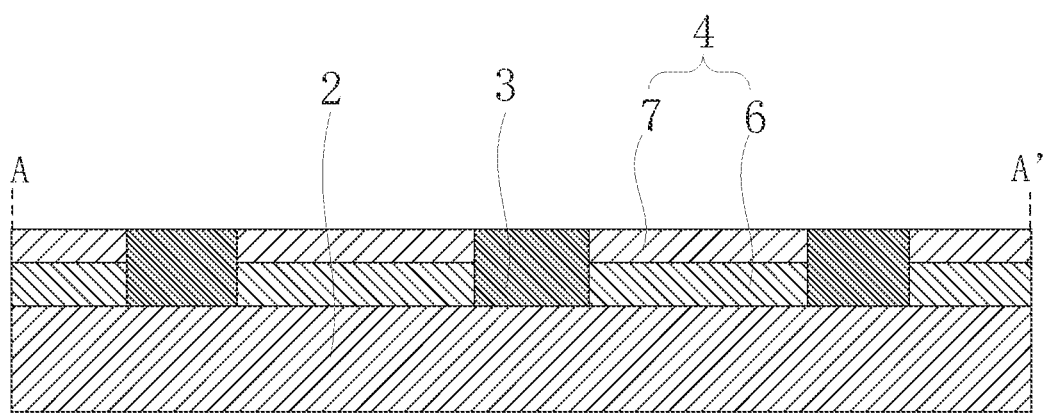
FIG. 4 is a schematic cross-sectional view along the line A-A' in FIG. 3.

In an embodiment, as shown in FIGS. 1-3, the pixel opening 5 includes a plurality of subpixel openings 13, the subpixel openings 13 are array-arranged; the color conversion medium 4 is positioned in the subpixel openings 13; the perovskite color conversion functional layer 6 in each of the subpixel openings 13 includes red conversion films 14, green conversion films 15, or blue conversion films 16. Therein, a material of the red conversion film 14 includes $CH_3NH_3Pb(Br/I)_3$ or $CsPb(Br/I)_3$, a material of the green conversion film 15 includes $CH_3NH_3PbBr_3$ or $CsPbBr_3$, and a material of the blue conversion film 16 includes $CH_3NH_3Pb(Br/Cl)_3$ or $CsPb(Br/Cl)_3$; therein, the red conversion film 14 can be excited to emit a red light, the green conversion film 15 can be excited to emit a green light, and the blue conversion film 16 can be excited to emit a blue light.

Specifically, as shown in FIG. 3, the plurality of subpixel openings 13 include a plurality of red subpixel openings 17, a plurality of green subpixel openings 18, and a plurality of blue subpixel openings 19; the red conversion films 14, the green conversion films 15, and the blue conversion films 16 are respectively corresponding to the red subpixel openings 17, the green subpixel openings 18, and the blue subpixel openings 19

In this embodiment, the color conversion medium 4 can be a monochromatic color conversion medium 4, that is, the perovskite color conversion functional layer 6 of the color conversion medium 4 can be excited to emit a monochromatic light. The monochromatic light can specifically be a red light, a green light, or a blue light. Of course, the color conversion medium 4 may also be a color conversion medium 4, that is, the materials of the perovskite color conversion functional layer 6 located in different subpixel openings 13 are different, and the colors of the corresponding light are also different; the material of the perovskite color conversion functional layer 6 located in different pixel openings 5 can be selected according to requirements of the product.

Figure 5:
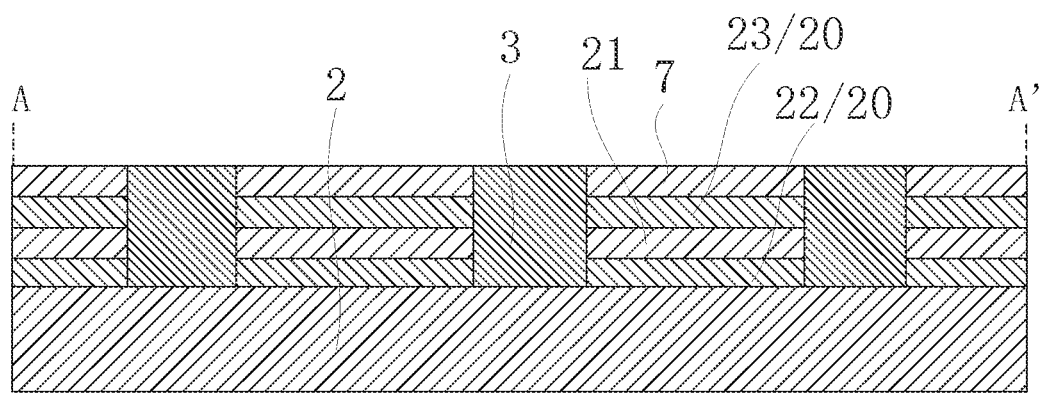
FIG. 5 is another schematic cross-sectional view along the line A-A' in FIG. 3.

As shown in FIG. 5, an embodiment of the present disclosure provides a display panel 1, which is different from the above embodiment in that, the perovskite color conversion functional layer 6 includes a plurality of stacked perovskite color conversion films 20 and a plurality of second water-oxygen barrier layers 21, each of the second water-oxygen barrier layers 21 is sandwiched between any two adjacent layers of the perovskite color conversion films 20; for example, the perovskite color conversion functional layer 6 includes a first perovskite color conversion film 22 and a second perovskite color conversion film 23, and the second water-oxygen barrier layer 21 is sandwiched between the first perovskite color conversion film 22 and the second perovskite color conversion film 23, the first water-oxygen barrier layer 7 is located on the second perovskite color conversion film 23.

Specifically, a material of the first water-oxygen barrier layer 7 and a material of the second water-oxygen barrier layer 21 are the same.

Specifically, a thickness of the first perovskite color conversion film 22 and a thickness of the first perovskite color conversion film 23 may be the same or different, and it is not limited herein.

In this embodiment, the perovskite color conversion functional layer 6 includes the plurality of stacked perovskite color conversion films 20, and the second water-oxygen barrier layer 21 is provided between any two adjacent layers of the perovskite color conversion films 20, a double protection of the first water-oxygen barrier layer 7 and the second water-oxygen barrier layer 21 can more effectively isolate the perovskite color conversion functional layer 6 from moisture and oxygen, thereby improving the stability of the perovskite color conversion functional layer 6, that is, improving a stability of the color conversion medium 4.

In an embodiment, as shown in FIG. 3, the pixel opening 5 includes the plurality of subpixel openings 13, the subpixel openings 13 are array-arranged; the color conversion medium 4 is positioned in the subpixel openings 13; the perovskite color conversion films 20 in each of the subpixel openings 13 includes red conversion films 14, green conversion films 15, or blue conversion films 16. Specifically, a material of each layer of the perovskite color conversion films 20 in the same subpixel opening 13 is the same (emitting the same color light). Therein, a material of the red conversion film 14 includes $CH_3NH_3Pb(Br/I)_3$ or $CsPb(Br/I)_3$, a material of the green conversion film 15 includes $CH_3NH_3PbBr_3$ or $CsPbBr_3$, and a material of the blue conversion film 16 includes $CH_3NH_3Pb(Br/Cl)_3$ or $CsPb(Br/Cl)_3$; therein, the red conversion film 14 can be excited to emit a red light, the green conversion film 15 can be excited to emit a green light, and the blue conversion film 16 can be excited to emit a blue light.

Specifically, the plurality of subpixel openings 13 includes spaced red subpixel openings 17, green subpixel openings 18, and blue subpixel openings 19; each layer of the perovskite color conversion films 20 in the red subpixel opening 17 is the red conversion film 14, each layer of the perovskite color conversion films 20 in the green subpixel opening 18 is the green conversion film 15, and each layer of the perovskite color conversion films 20 in the blue subpixel opening 19 is the blue conversion film 16.

In this embodiment, the color conversion medium 4 can be a monochromatic color conversion medium 4, that is, the perovskite color conversion functional layer 6 of the color conversion medium 4 can be excited to emit a monochromatic light. The monochromatic light can specifically be a red light, a green light, or a blue light. Of course, the color conversion medium 4 may also be a color conversion medium 4, that is, the materials of the perovskite color conversion functional layer 6 located in different subpixel openings 13 are different, and the colors of the corresponding light are also different; an illuminating color of the color conversion medium 4 can be selected according to requirements of the product.

Figure 6:
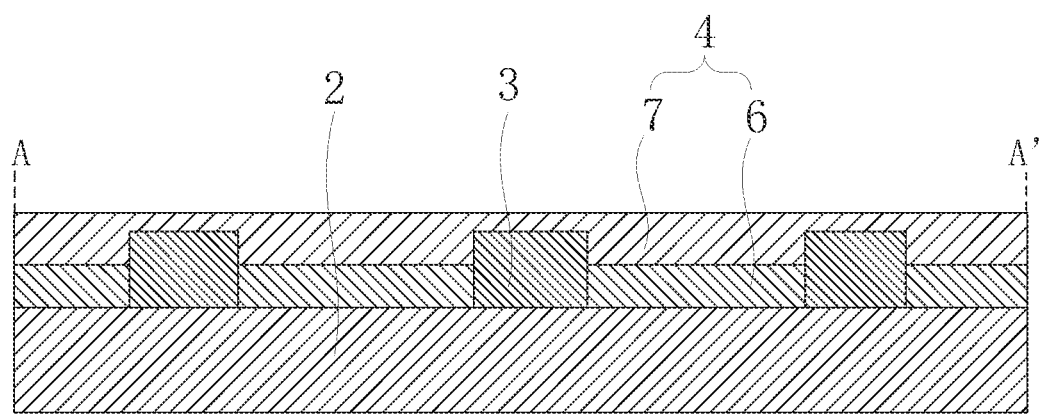
FIG. 6 is another schematic cross-sectional view along the line A-A' in FIG. 3.

As shown in FIG. 6, an embodiment of the present disclosure provides a display panel 1, which is different from the above embodiment in that, the first water-oxygen barrier layer 7 is positioned on the perovskite color conversion functional layer 6 and the pixel definition layer 3. In this embodiment, the first water-oxygen barrier layer 7 coats on the perovskite color conversion functional layer 6 and the pixel defining layer 3, so that moisture and oxygen can be prevented from entering from the contact interface between the first water-oxygen barrier layer 7 and the pixel defining layer 3, and the perovskite color conversion functional layer 6 can be further sealed in the pixel opening 5 to prevent the perovskite material from contacting with moisture and oxygen, thereby improving stability of the perovskite color conversion functional layer 6, that is, improving the stability of the color conversion medium 4.

Figure 7:
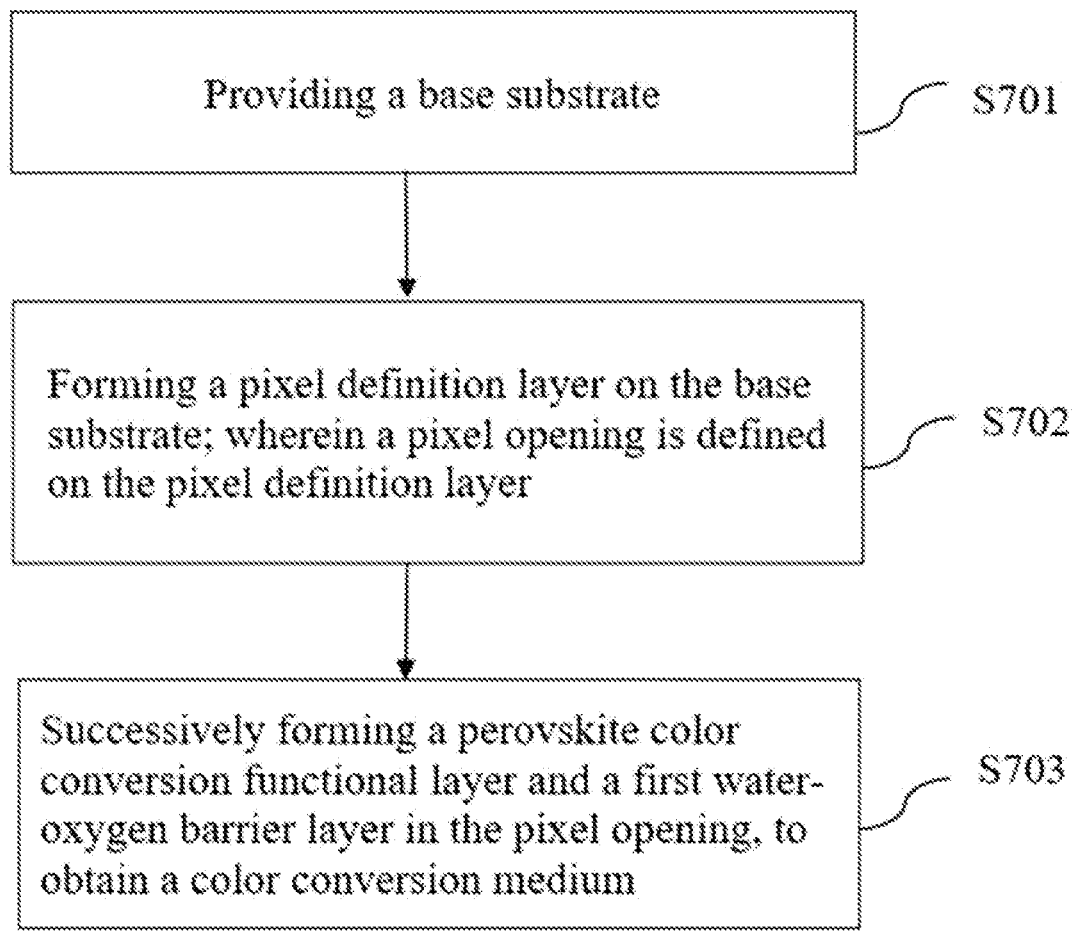
FIG. 7 is a schematic diagram of a process for manufacturing a display panel of an embodiment according to the present disclosure.

As shown in FIG. 7, an embodiment of the present disclosure further provides a manufacturing method of a display panel, which includes the following steps:

S701: providing a base substrate;

S702: forming a pixel definition layer on the base substrate; wherein a pixel opening is defined on the pixel definition layer;

S703: successively forming a perovskite color conversion functional layer and a first water-oxygen barrier layer in the pixel opening, to obtain a color conversion medium.

Specifically, the step S703 includes the following steps:

forming a plurality of perovskite color conversion films 20 by inkjet printing technology in the pixel opening 5, and forming a second water-oxygen barrier layer 21 sandwiched between any two adjacent layers of the perovskite color conversion films 20, the perovskite color conversion films 20 and the second water-oxygen barrier layers 21 form the perovskite color conversion functional layer 6; and forming the first water-oxygen barrier layer 7 on the perovskite color conversion functional layer 6.

Specifically, the display panel 1 further includes a TFT array substrate 8 opposite to the base substrate 2 and a blue OLED device 9 sandwiched between the base substrate 2 and the TFT array substrate 8, the color conversion medium 4 is positioned on a side of the base substrate 2 adjacent to the blue OLED device 9; the blue OLED device 9 includes an anode, a hole injection layer, a hole transfer layer, a blue light emitting layer, an electron transfer layer, an electron blocking layer, and a cathode, which are successively disposed on the TFT array substrate 8. Of course, the blue OLED device 9 can also be replaced with a white OLED device, which is not limited herein.

In this embodiment, in the display panel 1 obtained by the above manufacturing method, the first water-oxygen barrier layer 7 of the color conversion medium 4 can effectively seal the perovskite color conversion functional layer 6 in the pixel opening 5, thereby preventing the perovskite material from contacting with moisture and oxygen, and then improving the stability of the perovskite color conversion function layer 6, that is, the stability of the color conversion medium 4 is improved.

Figure 8:
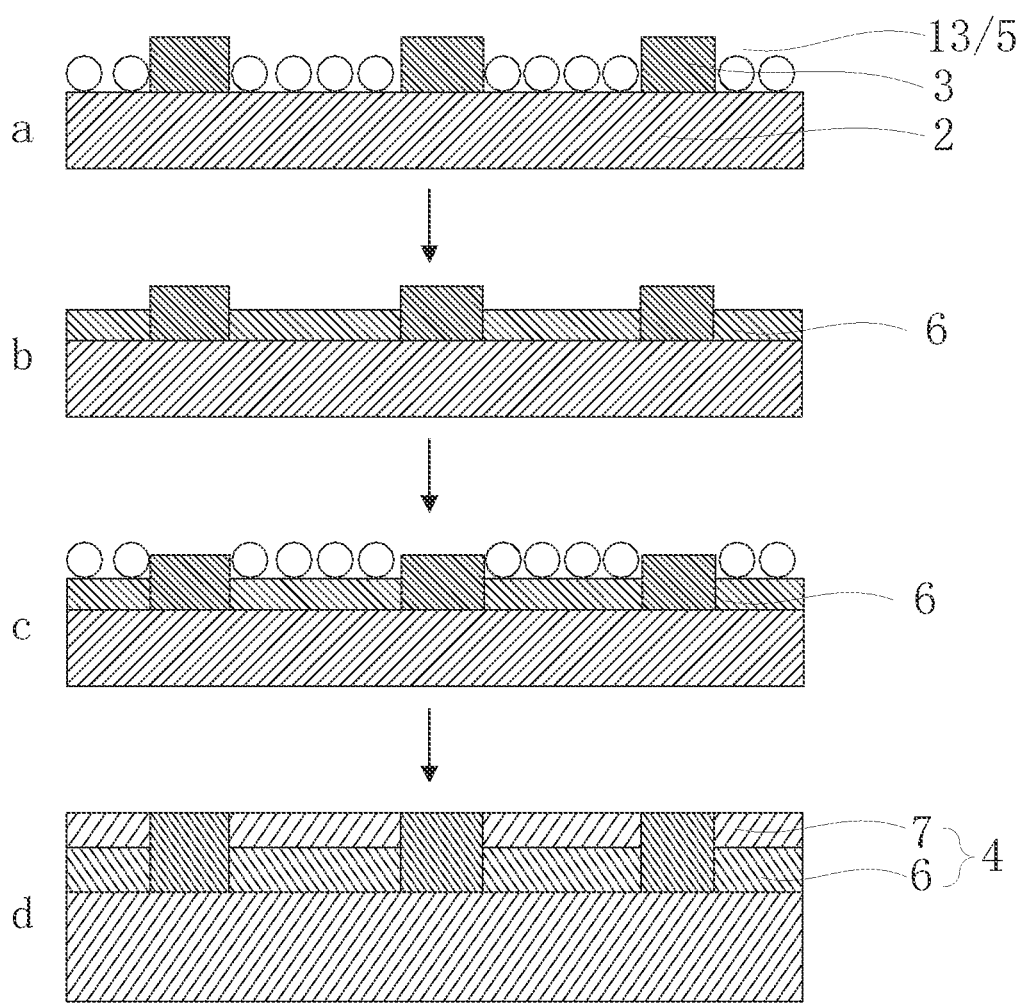
FIG. 8 is a schematic diagram of structures for manufacturing a color conversion medium of an embodiment according to the present disclosure.

As shown in FIG. 8, an embodiment of the present disclosure further provides a manufacturing method of the color conversion medium 4, which includes the following steps:

a perovskite ink with a target volume (for example, 20 drops in each subpixel opening 13) is printed in the pixel opening 5 by an inkjet printing technique, as shown by a in FIG. 8; then the base substrate 2 is placed in a VCD (vacuum dryer) cavity, and is held at a constant pressure (for example, 50 Pa) for about 10 minutes at a room temperature to form a perovskite color conversion functional layer 6, as shown by b in FIG. 8; then, a certain thickness of polymethyl methacrylate (PMMA, transparent) polymer ink is inkjet printed on the perovskite color conversion functional layer 6, as shown by c in FIG. 8; lastly, the printed polymer ink is subjected to thermal curing of wet film or UV (ultraviolet)

curing, to form the first water-oxygen barrier layer 7, and color conversion medium 4 is obtained, as shown by d in FIG. 8.

In this embodiment, in the color conversion medium 4 obtained by the above manufacturing method, the first water-oxygen barrier layer 7 can effectively seal the perovskite color conversion functional layer 6 in the pixel opening 5, thereby preventing the perovskite material from contacting with moisture and oxygen, and then improving the stability of the perovskite color conversion function layer 6, that is, the stability of the color conversion medium 4 is improved.

Figure 9:
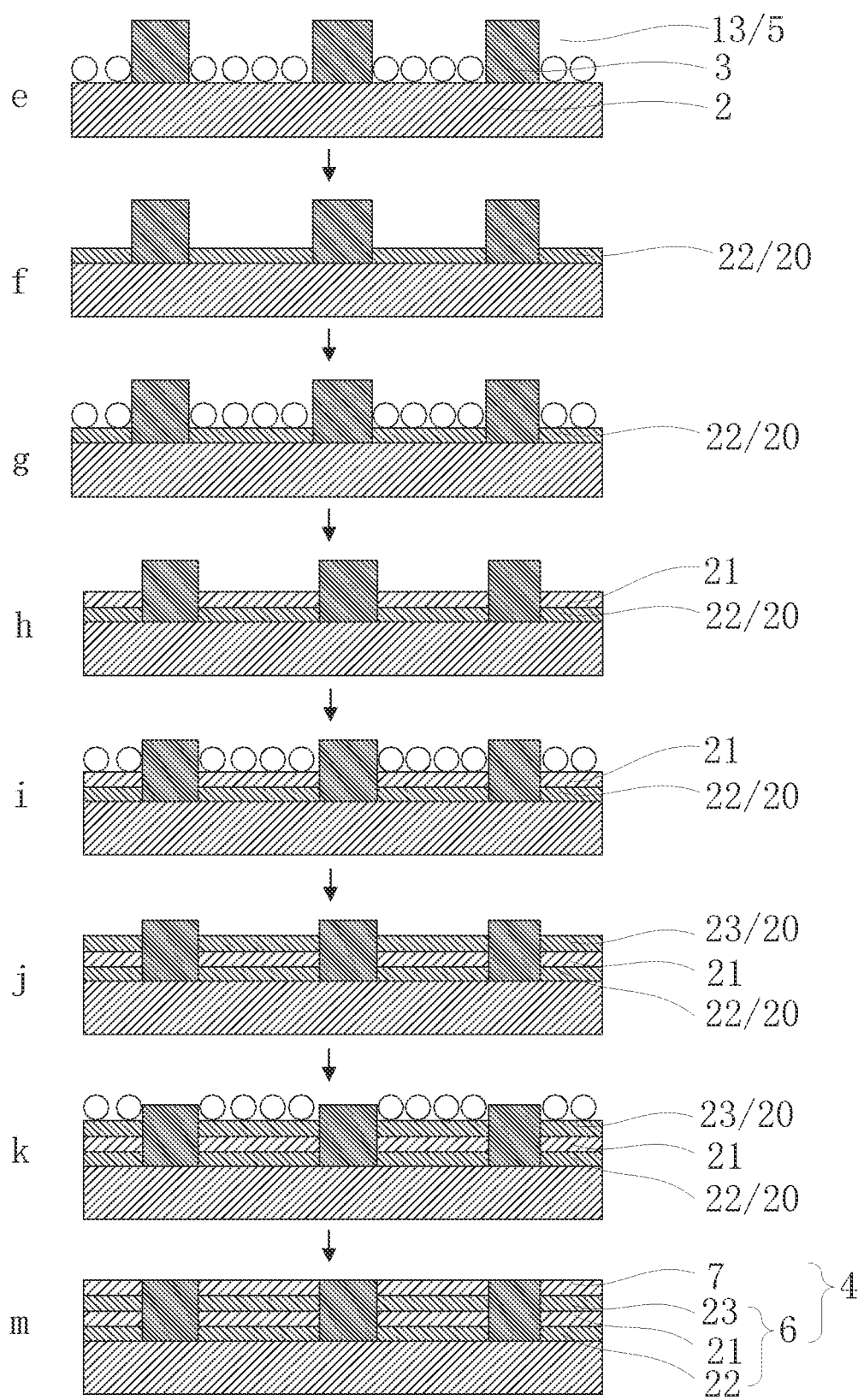
FIG. 9 is a schematic diagram of structures for manufacturing another color conversion medium of an embodiment according to the present disclosure.

As shown in FIG. 9, an embodiment of the present disclosure further provides a manufacturing method of the color conversion medium 4, which includes the following steps:

according to the number of layers of the perovskite color conversion films 20 of the perovskite color conversion functional layer 6, a perovskite ink with a target volume is printed through multiple times; taking the two-layer perovskite color conversion films 20 as an example, if the target volume of the perovskite ink is 20 drops in each subpixel opening 13, the number of printed drops of ink during the formation of the first perovskite color conversion film 22 is 10 drops; then, the printed base substrate 2 is placed in a VCD cavity, and held at a constant pressure (for example, 50 Pa) for about 5 minutes at a room temperature to form a first perovskite color conversion film 22, as shown by e and f in FIG. 9; then a certain thickness of polymethyl methacrylate polymer ink is ink-jet printed on the first perovskite color conversion film 22 and cured to form a second water-oxygen barrier layer 21, as shown by g and h in FIG. 9; 10 drops of perovskite ink is printed on the second water-oxygen barrier layer 21 and placed in the VCD cavity to be processed according to the condition that the first perovskite color conversion film 22 is dried to form a first perovskite color conversion film 23, as shown by i and j in FIG. 9; then a certain thickness of polymethyl methacrylate polymer ink is ink-jet printed on the first perovskite color conversion film 23 and solidified to form a first water-oxygen barrier layer 7, to obtain a cross structure of two-layer perovskite color conversion films 20—water-oxygen barrier layer, that is, the color conversion medium 4 is obtained, as shown by k and m in FIG. 9.

In this embodiment, in the color conversion medium 4 obtained by the above manufacturing method, a double protection of the first water-oxygen barrier layer 7 and the second water-oxygen barrier layer 21 can effectively seal the perovskite color conversion functional layer 6 in the pixel opening 5, thereby preventing the perovskite material from contacting with moisture and oxygen, and then improving the stability of the perovskite color conversion function layer 6, that is, the stability of the color conversion medium 4 is improved.

In the above, the present disclosure has been disclosed as above in the preferred embodiments. However, the preferred embodiments should not be construed as limitations of the present disclosure. Those skilled in the art can make various modifications without departing from the spirit and scope of the present disclosure. Hence, the scope of the present disclosure should be subject to the scope defined in the claims.

What is claimed is:

1. A display panel, comprising: a base substrate, a pixel definition layer, and a color conversion medium, the pixel definition layer and the color conversion medium being successively formed on the base substrate; wherein a pixel opening is defined on the pixel definition layer, the color conversion medium is positioned in the pixel opening;

wherein, the color conversion medium comprises a perovskite color conversion functional layer and a first water-oxygen barrier layer; the first water-oxygen barrier layer is positioned on a side of the perovskite color conversion functional layer away from the base substrate.

2. The display panel as claimed in claim 1, wherein the perovskite color conversion functional layer comprises a plurality of stacked perovskite color conversion films and a plurality of second water-oxygen barrier layers, each of the second water-oxygen barrier layers is sandwiched between any two adjacent layers of the perovskite color conversion films.

3. The display panel as claimed in claim 1, wherein a material of the first water-oxygen barrier layer comprises polymethyl methacrylate.

4. The display panel as claimed in claim 2, wherein a material of the first water-oxygen barrier layer and a material of the second water-oxygen barrier layer are the same.

5. The display panel as claimed in claim 1, wherein the first water-oxygen barrier layer is positioned on the perovskite color conversion functional layer and the pixel definition layer.

6. The display panel as claimed in claim 2, wherein the pixel opening comprises a plurality of subpixel openings, the subpixel openings are array-arranged; the color conversion medium is positioned in the subpixel openings;

the perovskite color conversion films in each of the subpixel openings comprises red conversion films, green conversion films, or blue conversion films.

7. The display panel as claimed in claim 6, wherein a material of the red conversion film comprises $CH_3NH_3Pb(Br/I)_3$ or $CsPb(Br/I)_3$, a material of the green conversion film comprises $CH_3NH_3PbBr_3$ or $CsPbBr_3$, and a material of the blue conversion film comprises $CH_3NH_3Pb(Br/Cl)_3$ or $CsPb(Br/Cl)_3$.

8. The display panel as claimed in claim 1, wherein the display panel further comprises a TFT array substrate opposite to the base substrate and a blue OLED device sandwiched between the base substrate and the TFT array substrate, and the color conversion medium is positioned on a side of the base substrate adjacent to the blue OLED device.

9. The display panel as claimed in claim 1, wherein a color filter is sandwiched between the base substrate and the pixel definition layer, and the color filter comprises a color resistance disposed corresponding to the pixel opening, and a light shielding layer disposed around the color resistance.

* * * * *